United States Patent
Lee et al.

(10) Patent No.: US 12,249,840 B2
(45) Date of Patent: Mar. 11, 2025

(54) ELECTRONIC DEVICE INCLUDING BATTERY

(71) Applicant: SAMSUNG ELECTRONICS CO., LTD., Suwon-si (KR)

(72) Inventors: Seunghoon Lee, Suwon-si (KR); Heecheul Moon, Suwon-si (KR); Kwonho Son, Suwon-si (KR); Yongseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 555 days.

(21) Appl. No.: 17/654,874

(22) Filed: Mar. 15, 2022

(65) Prior Publication Data

US 2022/0302756 A1    Sep. 22, 2022

Related U.S. Application Data

(63) Continuation of application No. PCT/KR2022/002912, filed on Mar. 2, 2022.

(30) Foreign Application Priority Data

Mar. 19, 2021  (KR) .................. 10-2021-0036231

(51) Int. Cl.
*H02J 50/10*       (2016.01)
*H02J 50/00*       (2016.01)
(Continued)

(52) U.S. Cl.
CPC ............ *H02J 50/10* (2016.02); *H02J 50/005* (2020.01); *H05K 1/0203* (2013.01); *H05K 1/028* (2013.01);
(Continued)

(58) Field of Classification Search
CPC ...... H02J 50/10; H02J 50/005; H05K 1/0203; H05K 1/028; H05K 1/14;
(Continued)

(56) References Cited

U.S. PATENT DOCUMENTS 9,800,700 B2    10/2017  Kwon et al.
10,097,227 B2   10/2018  Kang et al.
(Continued)

FOREIGN PATENT DOCUMENTS

CN        211128697 U      7/2020
KR    10-2015-0044739      4/2015
(Continued)

OTHER PUBLICATIONS

Search Report and Written Opinion issued Jun. 10, 2022 in counterpart International Patent Application No. PCT/KR2022/002912.

*Primary Examiner* — Paul Dinh
(74) *Attorney, Agent, or Firm* — Nixon & Vanderhye, P.C.

(57) ABSTRACT

An electronic device according to an embodiment includes: a front plate forming a front surface of the electronic device, a back plate forming a rear surface of the electronic device, a support located between the front plate and the back plate and including a first surface facing the front plate and a second surface facing the back plate, the support having an opening formed through the first surface and the second surface, a display at least partially disposed on the first surface of the support, a first circuit board, at least a portion of which is disposed on the second surface of the support, the first circuit board including a rigid area that at least partially covers the opening, and a battery disposed in the opening of the support and having a size smaller than or substantially the same as a size of the opening when the first surface or the second surface of the support member is
(Continued)

viewed from above, and the battery is at least partially attached to the rigid area.

20 Claims, 13 Drawing Sheets

(51) Int. Cl.
    *H05K 1/02*     (2006.01)
    *H05K 1/14*     (2006.01)

(52) U.S. Cl.
    CPC ..... *H05K 1/14* (2013.01); *H05K 2201/10037* (2013.01); *H05K 2201/10098* (2013.01); *H05K 2201/10128* (2013.01)

(58) Field of Classification Search
    CPC .......... H05K 2201/10037; H05K 2201/10098; H05K 2201/10128; H05K 1/147; H05K 1/189; H05K 3/4691; H04M 1/0262; H04M 1/0277
    USPC ......................................................... 320/108
    See application file for complete search history.

(56) References Cited

U.S. PATENT DOCUMENTS

| | | | |
|---|---|---|---|
| 10,158,261 B2 | 12/2018 | Jang et al. | |
| 10,230,415 B2 | 3/2019 | Kang et al. | |
| 10,567,561 B2 | 2/2020 | Kang et al. | |
| 10,680,470 B2 | 6/2020 | Jang et al. | |
| 10,741,905 B2 | 8/2020 | Kim et al. | |
| 10,827,049 B2 | 11/2020 | Kang et al. | |
| 10,879,506 B2 | 12/2020 | Kim et al. | |
| 10,996,713 B2 | 5/2021 | Pakula et al. | |
| 11,019,187 B2 | 5/2021 | Kang et al. | |
| 11,662,772 B2 | 5/2023 | Pakula et al. | |
| 2015/0097519 A1* | 4/2015 | Chen | H02J 50/005 320/108 |
| 2015/0365508 A1 | 12/2015 | Kwon et al. | |
| 2018/0301790 A1 | 10/2018 | Kim et al. | |
| 2019/0041909 A1 | 2/2019 | Pakula et al. | |
| 2019/0074491 A1 | 3/2019 | Kim et al. | |
| 2023/0224388 A1* | 7/2023 | Bates | H04M 1/0262 455/566 |

FOREIGN PATENT DOCUMENTS

| | | |
|---|---|---|
| KR | 10-2015-0143119 | 12/2015 |
| KR | 10-2208441 | 12/2015 |
| KR | 10-2016-0097106 | 8/2016 |
| KR | 10-2017-0019826 | 2/2017 |
| KR | 10-2017-0084444 | 7/2017 |
| KR | 10-2018-0116721 | 10/2018 |
| KR | 10-2019-0026202 | 3/2019 |

* cited by examiner

ELECTRONIC DEVICE INCLUDING BATTERY

CROSS-REFERENCE TO RELATED APPLICATIONS

This application is a continuation of International Application No. PCT/KR2022/002912 designating the United States, filed on Mar. 2, 2022, in the Korean Intellectual Property Receiving Office and claiming priority to Korean Patent Application No. 10-2021-0036231, filed on Mar. 19, 2021, in the Korean Intellectual Property Office, the disclosures of which are incorporated by reference herein in their entireties.

BACKGROUND

Field

The disclosure relates to an electronic device including a battery.

Description of Related Art

An electronic device may include a support member that supports structures such as a battery and a circuit board. The battery may be attached to one surface of the support member through an adhesive tape. A wireless charging coil, an MST antenna, an NFC antenna, and FPCBs for an interface may be disposed between the battery and a cover of a housing of the electronic device.

In the case of stacking the battery and parts (e.g., an FPCB on which at least one antenna is located) in the thickness direction in the electronic device to meet the demands for slimness of the electronic device, there may be a limitation in reducing the thickness of the electronic device.

SUMMARY

Embodiments of the disclosure provide a battery fixing structure for firmly fixing a battery, providing torsional and bending rigidity, and implementing a slim electronic device, and an electronic device including the battery fixing structure.

An electronic device according to example embodiments of the disclosure includes: a front plate that forms a front surface of the electronic device, a back plate that forms a rear surface of the electronic device, a support located between the front plate and the back plate and including a first surface facing the front plate and a second surface facing the back plate, the support having an opening in the first surface and the second surface, a display at least partially disposed on the first surface of the support, a first circuit board, at least a portion of which is disposed on the second surface of the support, the first circuit board including a rigid area that at least partially covers the opening, and a battery disposed in the opening of the support and having a size smaller than or substantially the same as a size of the opening when the first surface or the second surface of the support member is viewed from above, and the battery is at least partially attached to the rigid area.

An electronic device according to example embodiments of the disclosure includes: a front plate that forms a front surface of the electronic device, a back plate that forms a rear surface of the electronic device, a support located between the front plate and the back plate and having an opening formed therein, a battery disposed in the opening, a first circuit board disposed on the support to at least partially cover the opening and attached to the battery, and a fixing bracket fixing the first circuit board to the support. The support includes a first portion located in a first direction from the opening and a second portion located in a second direction opposite the first direction, and the fixing bracket extends in a third direction substantially perpendicular to the first direction and the second direction to at least partially cross the opening.

According to various example embodiments of the disclosure, the support extending between the battery and the front cover or the back cover may be replaced with the substrate including the rigid area and the flexible area. Accordingly, the gap between the battery and the front cover or the back cover of the electronic device may be reduced, and the entire thickness of the electronic device may be decreased. Further, the electronic device may include the battery having an increased capacity corresponding to the reduced gap between the battery and the cover. Furthermore, the wireless charging coil and the antenna may be disposed on the substrate, and thus assembly convenience may be improved. Moreover, the bending and torsional rigidity of the electronic device may be secured through the rigid area of the substrate and the fixing bracket.

In addition, the disclosure may provide various effects that are directly or indirectly recognized.

BRIEF DESCRIPTION OF THE DRAWINGS

The above and other aspects, features and advantages of certain embodiments of the present disclosure may be more apparent from the following detailed description, taken in conjunction with the accompanying drawings in which.

With regard to description of the drawings, identical or similar reference numerals may be used to refer to identical or similar components.

DETAILED DESCRIPTION

Hereinafter, various example embodiments of the disclosure may be described with reference to accompanying drawings. Those of ordinary skill in the art will recognize that modifications, equivalents, and/or alternatives on the various example embodiments described herein can be variously made without departing from the scope and spirit of the disclosure.

Figure 1:
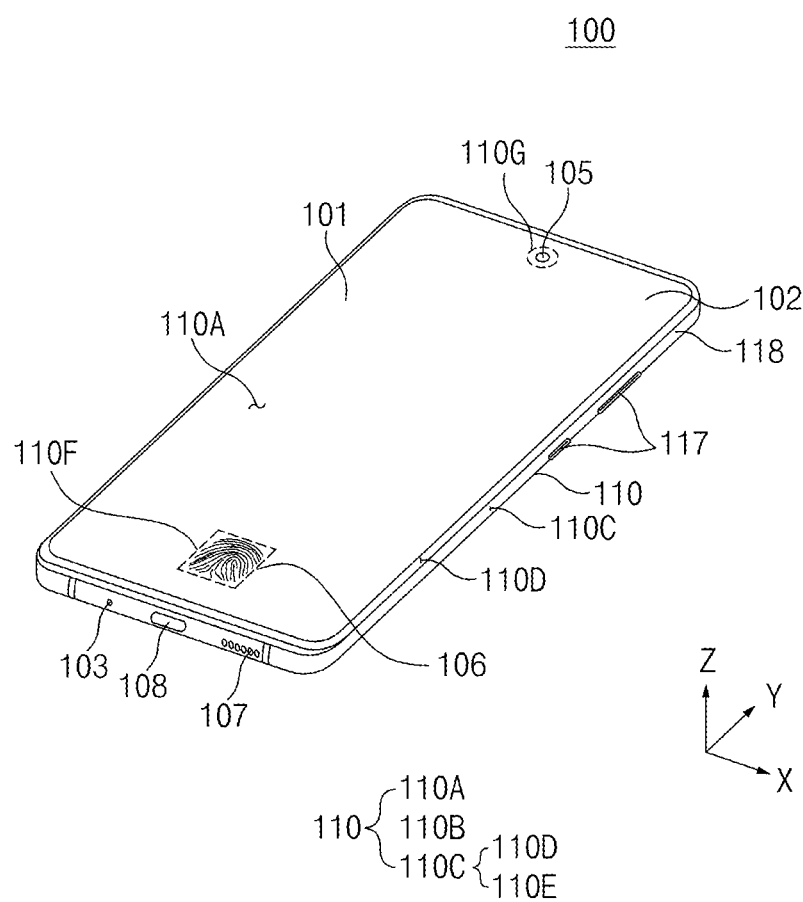
FIG. 1 is a front perspective view of an electronic device according to various embodiments
Figure 2:
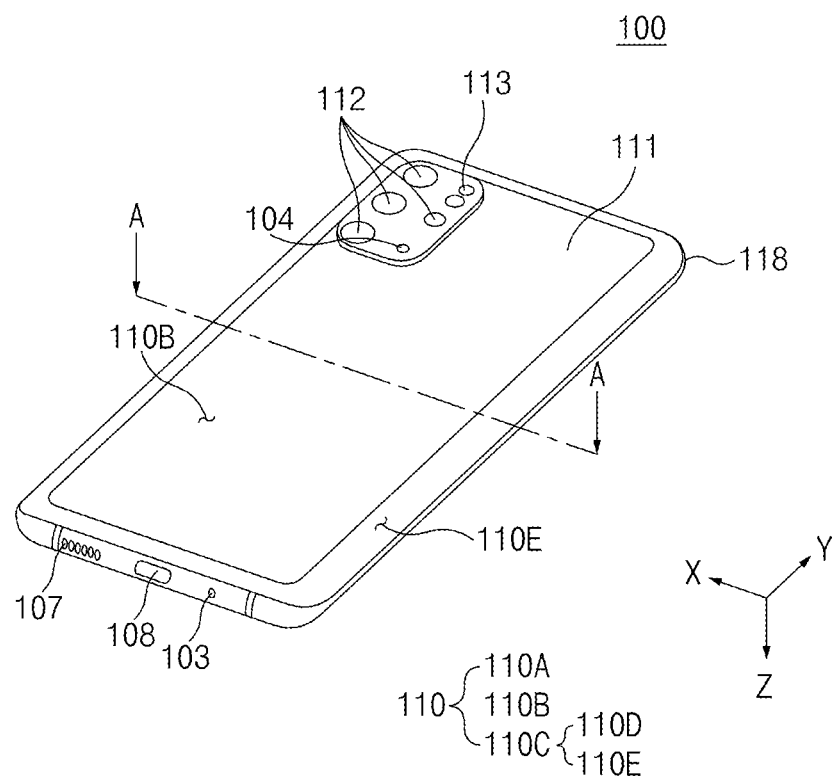
FIG. 2 is a rear perspective view of the electronic device according to various embodiments

FIG. 1 is a front perspective view of an electronic device according to various embodiments. FIG. 2 is a rear perspective view of the electronic device according to various embodiments.

Referring to FIGS. 1 and 2, the electronic device 100 may include a housing 110 that includes a first surface (or, a front surface) 110A, a second surface (or, a rear surface) 110B, and a side surface 110C surrounding a space between the first surface 110A and the second surface 110B.

In another embodiment (not illustrated), the housing 110 may refer to a structure that forms some of the first surface 110A, the second surface 110B, and the side surface 110C.

In an embodiment, the first surface 110A may be formed by a front plate 102 (e.g., a front plate 120 of FIG. 3), at least a portion of which is substantially transparent. For example, the front plate 102 may include a glass plate including various coating layers, or a polymer plate.

In an embodiment, the second surface 110B may be formed by a back plate 111 (e.g., a back plate 180 of FIG. 3) that is substantially opaque. The back plate 111 may be formed of, for example, coated or colored glass, ceramic, polymer, metal (e.g., aluminum, stainless steel (STS), or magnesium), or a combination of at least two of the aforementioned materials. The side surface 110C may be formed by a side bezel structure 118 (e.g., a frame structure 141 of FIG. 3) that is coupled with the front plate 102 and the back plate 111 and that contains metal and/or polymer.

In an embodiment, the back plate 111 and the side bezel structure 118 may be integrally formed with each other and may contain the same material (e.g., a metallic material such as aluminum).

In the illustrated embodiment, the front plate 102 may include two first areas 110D that curvedly and seamlessly extend from partial areas of the first surface 110A toward the back plate 111. The first areas 110D may be located at opposite long edges of the front plate 102.

In the illustrated embodiment, the back plate 111 may include two second areas 110E that curvedly and seamlessly extend from partial areas of the second surface 110B toward the front plate 102. The second areas 110E may be located at opposite long edges of the back plate 111.

In an embodiment, the front plate 102 (or, the back plate 111) may include only one of the first areas 110D (or, the second areas 110E). Furthermore, in an embodiment, the front plate 102 (or, the back plate 111) may not include a part of the first areas 110D (or, the second areas 110E).

In an embodiment, when viewed from a side of the electronic device 100, the side bezel structure 118 may have a first thickness (or, width) at sides (e.g., short sides) not including the first areas 110D or the second areas 110E and may have a second thickness at sides (e.g., long sides) including the first areas 110D or the second areas 110E, the second thickness being smaller than the first thickness. In various embodiments, the side bezel structure 118 may be integrally formed with the back plate 111.

In an embodiment, the electronic device 100 may include at least one of a display 101 (e.g., a display 130 of FIG. 3), audio modules 103, 104, and 107, a sensor module (not illustrated), a second sensor module 106, camera modules 105 and 112, key input devices 117, a light emitting element (not illustrated), and/or a connector hole 108. In an embodiment, at least one component (e.g., the key input devices 117 or the light emitting element (not illustrated)) among the aforementioned components may be omitted from the electronic device 100, or other component(s) may be additionally included in the electronic device 100.

In an embodiment, the display 101 may be exposed through at least a portion of the front plate 102. For example, at least a portion of the display 101 may be exposed through the front plate 102 that includes the first surface 110A and the first areas 110D of the side surface 110C.

In an embodiment, the shape of the display 101 may be formed to be substantially the same as the shape of the adjacent outside edge of the front plate 102. In an embodiment (not illustrated), to expand the area by which the display 101 is exposed, the gap between the periphery of the display 101 and the periphery of the front plate 102 may be substantially constant.

In an embodiment, a surface of the housing 110 (or, the front plate 102) may include a screen display area through which the display 101 is visually exposed and on which contents are displayed through pixels. For example, the screen display area may include the first surface 110A and the first areas 110D of the side surface.

In an embodiment (not illustrated), the display 101 may include, or may be disposed adjacent to, touch detection circuitry, a pressure sensor for measuring the intensity (pressure) of a touch, and/or a digitizer for detecting a stylus pen of a magnetic field type.

In an embodiment, the screen display area 110A and 110D may include a sensing area 110F and/or a camera area 110G.

In an embodiment, the sensing area 110F may at least partially overlap the screen display area 110A and 110D. The sensing area 110F may refer to an area that displays contents likewise to the other areas of the screen display area 110A and 110D and through which an input signal related to the second sensor module 106 additionally passes.

In an embodiment, at least a portion of the second sensor module 106 may be disposed under the screen display area 110A and 110D. The second sensor module 106 may form the sensing area 110F in at least a portion of the screen display area 110A and 110D. The second sensor module 106 may be configured to receive an input signal passing through the sensing area 110F and generate an electrical signal based on the received input signal. For example, the input signal may have a specified physical quantity (e.g., heat, light, temperature, sound, pressure, or ultrasonic waves). For example, the input signal may include a signal related to biometric information (e.g., a fingerprint) of a user.

For example, the second sensor module 106 may include an optical fingerprint sensor configured to receive light. For example, the second sensor module 106 may be configured to receive an optical signal that is emitted from a pixel included in the display 101 and reflected by a fingerprint of the user's finger and that passes through the sensing area 110F.

For example, the second sensor module 106 may include an ultrasonic fingerprint sensor configured to transmit and receive ultrasonic waves. For example, the second sensor module 106 may include a transmitting module that transmits ultrasonic waves toward a fingerprint of the user's finger and a receiving module that receives the ultrasonic waves that are reflected by the finger and that pass through the sensing area 110F.

In an embodiment, the camera area may at least partially overlap the screen display area 110A and 110D. The camera area 110G may refer to an area (e.g., a transmissive area) that displays contents likewise to the other areas of the screen display area 110A and 110D and through which an optical signal related to the first sensor module 105 additionally passes. For example, the camera area 110G may be configured to display contents likewise to the other areas of the screen display area 110A and 110D when the first camera module 105 does not operate. In an embodiment, the camera area 110G of the display 101 may be formed to be a transmissive area having a specified transmittance. For example, the transmissive area may have a transmittance of about 20% to about 40%. The transmissive area may include an area having a lower pixel density and/or wiring density than a surrounding area.

In an embodiment, the first camera module 105 may be at least partially disposed under the screen display area 110A and 110D and may be configured to receive light passing through the camera area 110G. For example, the light received by the first camera module 105 may include light reflected by or emitted from an object. The first camera module 105 may be configured to generate an image-related electrical signal based on the received light. The first camera module 105 may not be exposed on a surface (e.g., the front surface 110A) of the electronic device 100. For example, the first camera module 105 may be hidden by contents displayed on the camera area 110G. For example, the optical axis of a lens included in the first camera module 105 may be disposed to pass through the camera area 110G included in the display 101.

In an embodiment, the second camera module 112 may include a plurality of camera modules (e.g., a dual camera, a triple camera, or a quad camera). However, the second camera module 112 is not necessarily limited to including the plurality of camera modules and may include one camera module.

In an embodiment, the first camera module 105 and/or the second camera module 112 may include one or more lenses, an image sensor, and/or an image signal processor. A flash 113 may include, for example, a light emitting diode or a xenon lamp. In an embodiment, two or more lenses (an infrared camera lens, a wide angle lens, and a telephoto lens) and image sensors may be disposed in the housing to face toward one surface (e.g., the second surface 110B) of the electronic device 100.

In an embodiment, the sensor module (not illustrated) may generate an electrical signal or a data value that corresponds to an operational state inside the electronic device 100 or an environmental state external to the electronic device 100. In an embodiment, the sensor module (not illustrated) may be disposed on at least a portion of the first surface 110A, the second surface 110B, or the side surface 110C (e.g., the first areas 110D and/or the second areas 110E) of the housing 110.

In various embodiments, the sensor module and/or the second sensor module 106 may include at least one of a proximity sensor, an HRM sensor, a fingerprint sensor, a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor. In various embodiments (not illustrated), the fingerprint sensor may be disposed on the second surface 110B.

In an embodiment, the audio modules 103, 104, and 107 may include the microphone holes 103 and 104 and the speaker hole 107.

In an embodiment, the microphone holes 103 and 104 may include the first microphone hole 103 formed in a partial area of the side surface 110C and the microphone hole 104 formed in a partial area of the second surface 110B. Microphones for obtaining external sounds may be disposed in the housing 110 to correspond to the microphone holes 103 and 104. The microphones may each include a plurality of microphones to detect the direction of a sound. In an embodiment, the second microphone hole 104 formed in the partial area of the second surface 110B may be disposed adjacent to the camera modules 105 and 112. For example, the second microphone hole 104 may obtain sounds when the camera modules 105 and 112 are executed, or may obtain sounds when other functions are executed.

In an embodiment, the speaker hole 107 may include a receiver hole for telephone call (not illustrated). The speaker hole 107 may be formed in a portion of the side surface 110C of the electronic device 100. In an embodiment, the speaker hole 107, together with the microphone hole 103, may be implemented as a single hole. Although not illustrated, the receiver hole for telephone call (not illustrated) may be formed in another portion of the side surface 110C. For example, the receiver hole for telephone call (not illustrated) may be formed in another portion (e.g., a portion facing the +Y-axis direction) of the side surface 110C that faces the portion (e.g., a portion facing the −Y-axis direction) of the side surface 110C in which the speaker hole 107 is formed.

In an embodiment, the electronic device 100 may include a speaker fluidly connected with the speaker hole 107. In an embodiment, the speaker may include a piezoelectric speaker that does not have the speaker hole 107.

In an embodiment, the key input devices 117 may be disposed on the side surface 110C (e.g., the first areas 110D and/or the second areas 110E) of the housing 110. In an embodiment, the electronic device 100 may not include all or some of the key input devices 117, and the key input devices 117 not included may be implemented in a different form, such as a soft key, on the display 101. In an embodiment, the key input devices may include the second sensor module 106 that forms the sensing area 110F included in the screen display area 110A and 110D.

In an embodiment, the connector hole 108 may accommodate a connector. The connector hole 108 may be disposed in the side surface 110C of the housing 110. For example, the connector hole 108 may be disposed in the side surface 110c so as to be adjacent to at least a part of the audio modules (e.g., the microphone hole 103 and the speaker hole 107). In an embodiment, the electronic device 100 may include the first connector hole 108 capable of accommodating a connector (e.g., a USB connector) for transmitting/receiving power and/or data with an external electronic device, and/or a second connector hole (not illustrated) capable of accommodating a connector (e.g., an earphone jack) for transmitting/receiving audio signals with an external electronic device.

In an embodiment, the electronic device 100 may include the light emitting element (not illustrated). For example, the light emitting element (not illustrated) may be disposed on the first surface 110A of the housing 110. The light emitting element (not illustrated) may provide state information of the electronic device 100 in the form of light. In an embodiment, the light emitting element (not illustrated) may provide a light source that operates in conjunction with operation of the first camera module 105. For example, the light emitting element (not illustrated) may include an LED, an IR LED, and/or a xenon lamp.

Figure 3:
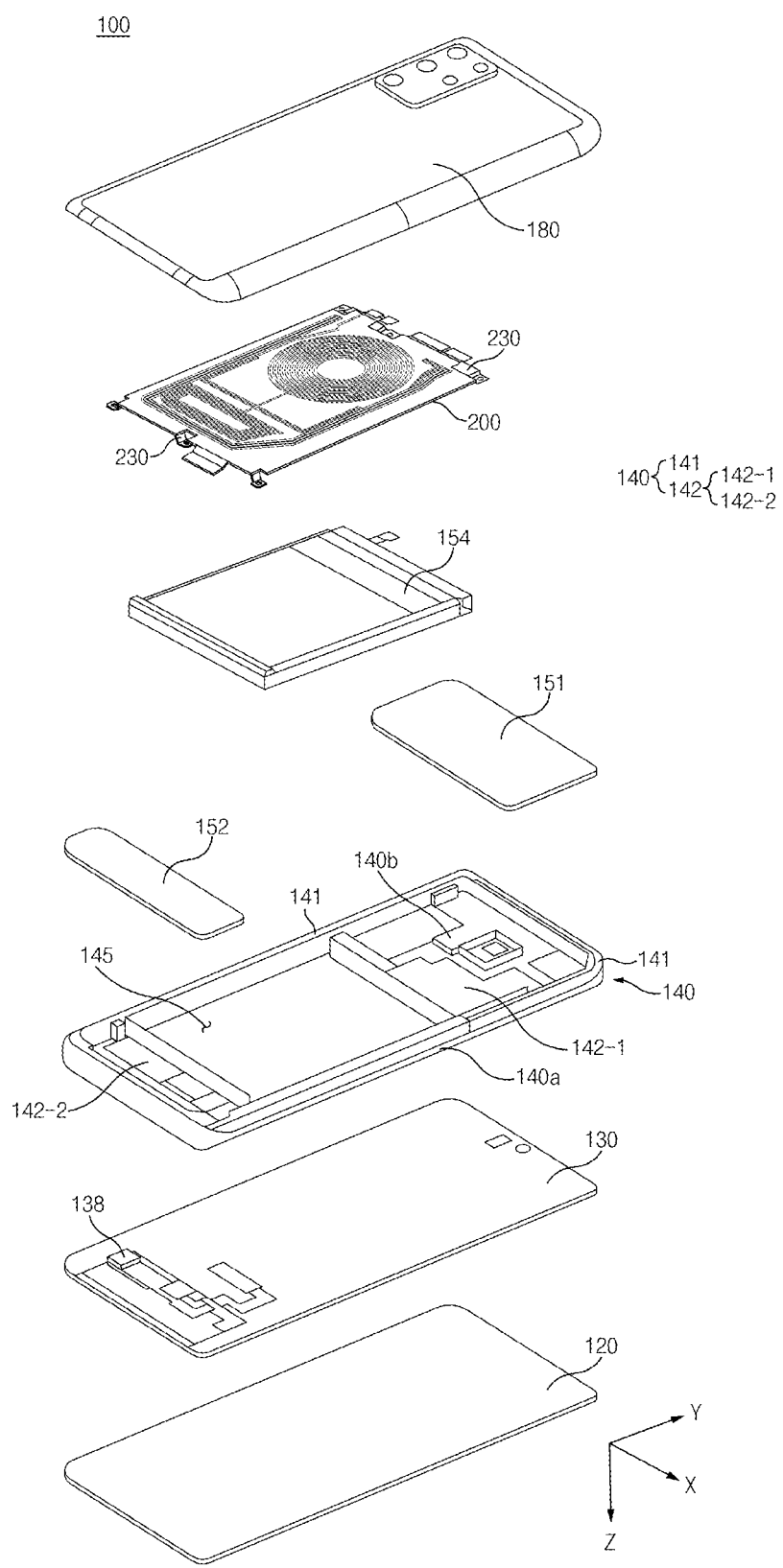
FIG. 3 is an exploded perspective view of the electronic device according to various embodiments.

FIG. 3 is an exploded perspective view of the electronic device according to various embodiments.

Referring to FIG. 3, the electronic device 100 may include the front plate 120 (e.g., the front plate 102 of FIG. 1), the display 130 (e.g., the display 101 of FIG. 1), a support member 140 (e.g., a bracket), a first circuit board 200, a second circuit board 151, a third circuit board 152, a battery 154, and the back plate 180 (e.g., the back plate 111 of FIG. 2). In various embodiments, at least one of the aforementioned components may be omitted from the electronic device 100, or other component(s) may be additionally included in the electronic device 100. At least one of the components of the electronic device 100 may be identical or similar to at least one of the components of the electronic device 100 of FIG. 1 or FIG. 2, and repetitive descriptions will hereinafter be omitted.

In various embodiments, the front plate 120, the back plate 180, and a frame structure 141 of the support member 140 may form the housing (e.g., the housing 110 of FIGS. 1 and 2). In various embodiments, the front plate 120 and the display 130 may be referred to as the display module. For example, the front plate 120 may include at least one layer included in the display module.

In an embodiment, the support member (e.g., a support) 140 may include the frame structure (e.g., a frame) 141 and a plate structure (e.g., a plate) 142. In an embodiment, the frame structure 141 may be formed to surround the periphery of the plate structure 142. For example, the frame structure 141 may form a portion of the housing (e.g., the housing 110 of FIG. 1). For example, the frame structure 141 may surround the space between the front plate 120 and the back plate 180 and may form a portion of a surface (e.g., the side surface) of the electronic device 100. For example, the frame structure 141 may be formed to connect the periphery of the front plate 120 and the periphery of the back plate 180. In an embodiment, the plate structure 142 may be a structure on which various structures included in the electronic device are disposed. For example, the display 130, the first circuit board 200, the second circuit board 151, and the third circuit board 152 may be disposed on the plate structure 142.

In an embodiment, the plate structure 142 of the support member 140 may include a first surface 140a at least partially facing the display 130 and a second surface 140b at least partially facing the back plate 180. For example, the first surface 140a may be a surface facing the +z-axis direction, and the second surface 140b may be a surface facing the −z-axis direction. In an embodiment, an opening 145 penetrating the first surface 140a and the second surface 140b may be formed in the plate structure 142. In an embodiment, at least a portion of the display 130 may be located on the first surface 140a of the plate structure 142. In an embodiment, at least a portion of each of the first circuit board 200, the second circuit board 151, and the third circuit board 152 may be located on the second surface 140b of the plate structure 142. In an embodiment, the battery 154 may be disposed in the opening 145 of the plate structure 142.

In an embodiment, the plate structure 142 may include a first portion 142-1 on one side of the opening 145 and a second portion 142-2 on an opposite side of the opening 145. For example, the first portion 142-1 may be located in the +y-axis direction with respect to the opening 145, and the second portion 142-2 may be located in the −y-axis direction with respect to the opening 145. For example, at least a portion of the second circuit board 151 may be disposed on the first portion 142-1. For example, at least a portion of the third circuit board 152 may be disposed on the second portion 142-2.

In an embodiment, the battery 154, which is a device for supplying power to at least one component of the electronic device 100, may include, for example, a primary cell that is not rechargeable, a secondary cell that is rechargeable, or a fuel cell. In an embodiment, the battery 154 may be disposed in the opening 145 of the plate structure 142.

In an embodiment, when the support member 140 (e.g., the first surface 140a of the plate structure 142) is viewed from above, the battery 154 may be formed in a size smaller than or substantially the same as the size of the opening 145. For example, when the battery is viewed in the +z-axis direction, the battery 154 may be formed so as not to overlap the support member 140. For example, when viewed in the +z-axis direction, the battery 154 may not be supported by the first portion 142-1, the second portion 142-2, and the frame structure 141 that are around the opening 145.

In an embodiment, when the support member 140 (e.g., the second surface 140b of the plate structure 142) is viewed from above, the battery 154 may be formed in a size smaller than or substantially the same as the size of the opening 145. For example, when the battery is viewed in the −z-axis direction, the battery 154 may be formed so as not to overlap the support member 140. For example, when viewed in the −z-axis direction, the battery 154 may not be supported by the first portion 142-1, the second portion 142-2, and the frame structure 141 that are around the opening 145.

In an embodiment, the battery 154 may be attached to the surface of the first circuit board 200 that faces the +z direction. For example, the battery 154 may be fixed to the inside of the opening 145 through the first circuit board 200.

In an embodiment, the first circuit board 200 may be disposed to at least partially cover the opening 145 of the plate structure 142. In an embodiment, the first circuit board 200 may electrically connect the second circuit board 151 and the third circuit board 152. For example, a conductive pattern for electrically connecting the second circuit board 151 and the third circuit board 152 may be formed on the first circuit board 200.

In an embodiment, when viewed in the +z-axis or −z-axis direction, the first circuit board 200 may be formed to be at least partially larger than the opening 145. For example, the first circuit board 200 may be formed to be longer in the y-axis directions than the opening 145 and/or may be formed to be longer in the x-axis directions than the opening 145. For example, the first circuit board 200 may be coupled by the frame structure 141 and/or at least one of the first portion 142-1 or the second portion 142-2 around the opening 145.

In an embodiment, a fixing bracket 230 may be coupled to an edge of the first circuit board 200. The fixing bracket 230 may be coupled to the frame structure 141 or the first portion 142-1 or the second portion 142-2 of the plate structure 142. Accordingly, the first circuit board 200 may be fixedly coupled to the support member 140. For example, the fixing bracket 230 may be disposed at the edges of the first circuit board 200 that face the +y-axis/−y-axis directions.

In an embodiment, an antenna pattern may be formed on the first circuit board 200. For example, the antenna pattern may be formed on the surface of the first circuit board 200 that faces toward the back plate 180. The antenna pattern may include, for example, a near field communication (NFC) antenna, a wireless charging antenna, an ultra wide band (UWB) antenna, and/or a magnetic secure transmission (MST) antenna. For example, the antenna pattern may be configured to perform short-range communication with an external device or wirelessly transmit and receive power required for charging.

In an embodiment, a processor, memory, and/or an interface may be disposed on the second circuit board 151 and the third circuit board 152. The processor may include, for example, one or more of a central processing unit, an application processor, a graphic processing unit, an image signal processor, a sensor hub processor, or a communication processor. In an embodiment, the interface may include, for example, a high definition multimedia interface (HDMI), a universal serial bus (USB) interface, an SD card interface, and/or an audio interface. For example, the interface may electrically or physically connect the electronic device 100 with an external electronic device and may include a USB connector, an SD card/MMC connector, or an audio connector.

In an embodiment, the memory may include, for example, volatile memory or nonvolatile memory.

Figure 4:
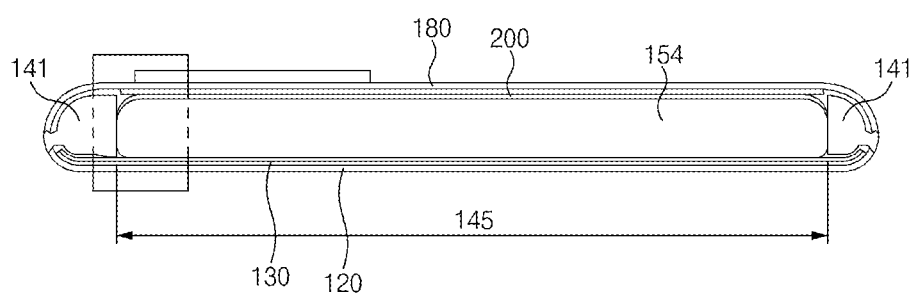
FIG. 4 is a cross-sectional view of the electronic device according to various embodiments
Figure 4:
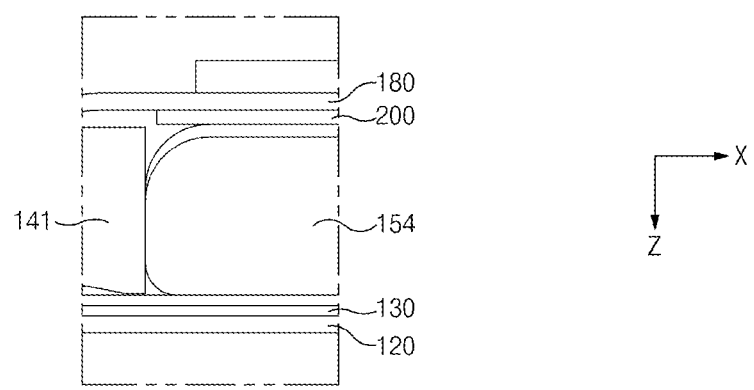

FIG. 4 is a cross-sectional view of the electronic device according to various embodiments. FIG. 4 is a sectional view taken along line A-A illustrated in FIG. 2.

Referring to FIG. 4, the battery 154 may be disposed in the opening 145 of the support member 140. The support member 140 may include the frame structure 141 that is disposed between the front plate 120 and the back plate 180 and that forms a portion of a surface of the electronic device 100. For example, the frame structure 141 may support the display 130, the periphery of the front plate 120, and the periphery of the back plate 180.

In an embodiment, the opening 145 of the support member 140 may be substantially formed through the support member 140 in the z-axis directions. For example, referring to FIG. 4, the opening 145 may be formed in a size larger than or substantially the same as the size of the battery 154. For example, when viewed on the section illustrated in FIG. 4, the opening 145 may be defined between the frame structures 141 of the support member 140.

In an embodiment, the battery 154 may be formed so as not to overlap the support member 140 when viewed in the z-axis directions. That is, the support member 140 may not extend between the battery 154 and the back plate 180 and between the battery 154 and the front plate 120. In an embodiment, the battery 154 may be attached to one surface of the first circuit board 200.

In an embodiment, the first circuit board 200 may be disposed between the battery 154 and the back plate 180. In various embodiments, when viewed in the x-axis directions and/or the y-axis directions, the first circuit board 200 may be formed to be larger than the battery 154. The first circuit board 200 may be fixed to the structures of the support member 140 (e.g., the frame structure 141, and the first portion 142-1 and the second portion 142-2 of the plate structure 142) and may support the battery 154 such that the battery 154 is located in the opening 145.

According to an embodiment, as the battery 154 is supported by the first circuit board 200 and is not supported by the support member 140, the space between the battery 154 and the display 130 may be reduced, and the overall thickness of the electronic device 100 may be decreased. The electronic device 100 according to an embodiment may be configured such that a portion of the battery 154 is disposed in the space occupied by the support member 140. Accordingly, the electronic device 100 may include the battery 154 having a relatively large size (e.g., thickness) without an increase in thickness.

Figure 5:
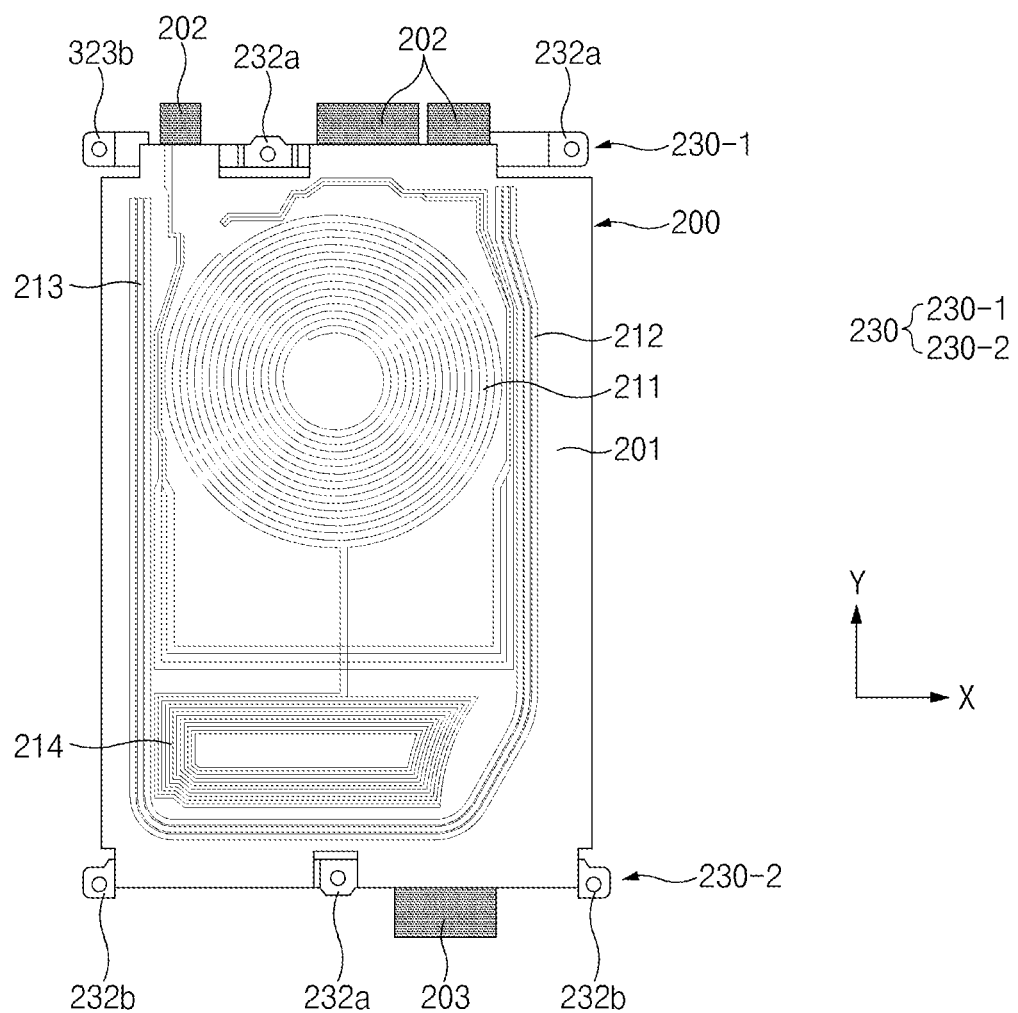
FIG. 5 is a diagram illustrating a first circuit board and a fixing bracket of the electronic device according to various embodiments.
Figure 6:
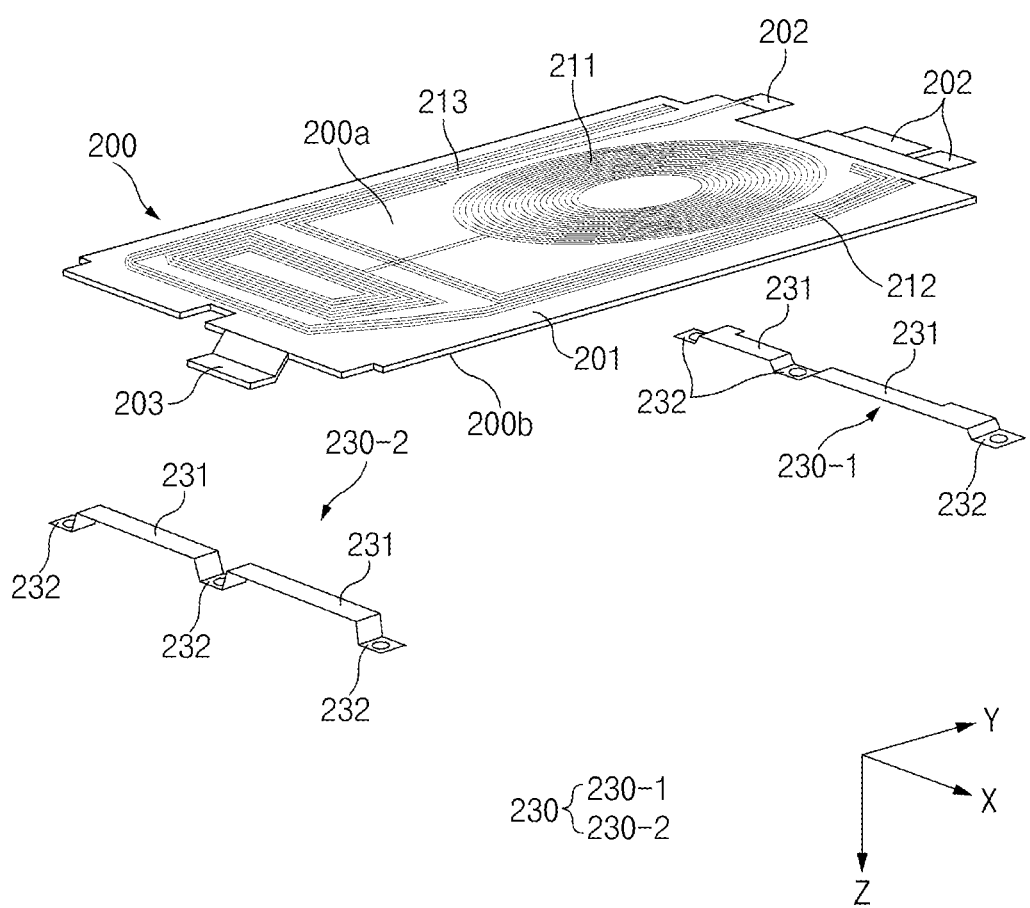
FIG. 6 is an exploded perspective view illustrating the first circuit board and the fixing bracket of the electronic device according to various embodiments.

FIG. 5 is a diagram illustrating the first circuit board and the fixing bracket of the electronic device according to various embodiments. FIG. 6 is an exploded perspective view illustrating the first circuit board and the fixing bracket of the electronic device according to various embodiments.

Referring to FIG. 5, the first circuit board 200 may include a rigid-flexible printed circuit board (RFPCB) that is at least partially flexible. For example, the first circuit board 200 may include a rigid area 201 on which a charging coil is disposed or a charging coil pattern 211 is formed and flexible areas 202 and 203 (e.g., the shaded portions in the drawing) that flexibly extend from the rigid area 201 to a second circuit board (e.g., the second circuit board 151 of FIG. 3) or a third circuit board (e.g., the third circuit board 152 of FIG. 3). For example, the flexible areas 202 and 203 may include the first flexible area 202 extending from the rigid area 201 to the second circuit board and the second flexible area 203 extending from the rigid area 201 to the third circuit board.

In an embodiment, the first flexible area 202 may extend in the y-axis direction from the rigid area 201, and the second flexible area 203 may extend in the −y-axis direction from the rigid area 201.

In an embodiment, the first circuit board 200 may include a plurality of conductive patterns. For example, the plurality of conductive patterns may include a charging coil pattern 211 related to wireless charging of the battery 154, an antenna pattern 214 related to a communication function of the electronic device 100, a first conductive pattern 212 connecting the second circuit board (e.g., the second circuit board 151 of FIG. 3) and the third circuit board (e.g., the third circuit board 152 of FIG. 3), and a second conductive pattern 213 related to the display (e.g., the display 130 of FIG. 3).

However, the first conductive pattern 212 and the second conductive pattern 213 illustrated in the drawings are merely illustrative, and the positions, shapes, and structures of the first conductive pattern 212 and the second conductive pattern 213 are not limited to those illustrated in the drawings.

For example, the charging coil pattern 211 may be formed on the rigid area 201 of the first circuit board 200. The charging coil pattern 211 may be configured to interact with a coil located outside the electronic device 100 to supply power to the battery 154. Power applied through the charging coil pattern 211 may be directly supplied to the battery 154, or may be supplied to the battery 154 through the second circuit board 151 or the third circuit board 152. In various embodiments, the charging coil pattern 211 may be replaced with a charging module separately provided to be disposed on the first circuit board 200.

For example, the antenna pattern 214 may include a near field communication (NFC) antenna and/or a magnetic secure transmission (MST) antenna. The antenna pattern 214 may be electrically connected to a communication module disposed on the second circuit board (e.g., the second circuit board 151 of FIG. 3) and/or the third circuit board (e.g., the third circuit board 152 of FIG. 3). For example, the antenna pattern 214 may be connected with the communication module through a conductive pattern extending through the first flexible area 202 and a conductive pattern extending through the second flexible area 203.

For example, the first conductive pattern 212 may electrically connect an interface module (e.g., a USB input/output module) and/or an LTE antenna pattern disposed on the third circuit board (e.g., the third circuit board 152 of FIG. 3) and a processor disposed on the second circuit board (e.g., the second circuit board 151 of FIG. 3). For example, the first conductive pattern 212 may extend from the first flexible area 202 to the second flexible area 203 through the rigid area 201.

For example, the second conductive pattern 213 may be configured to electrically connect a display driver IC (e.g., a display driver IC 138 of FIG. 3) located on the rear surface of the display (e.g., the display 130 of FIG. 3) and the second circuit board (e.g., the second circuit board 151 of FIG. 3) and/or the third circuit board (e.g., the third circuit board 152 of FIG. 3). For example, the second conductive pattern 213 may electrically connect the third circuit board 152 to which the display driver IC 138 is connected and the second circuit board 151 on which the processor is disposed. For example, the second conductive pattern 213 may extend to at least a part of the second flexible area 203, the rigid area 201, and the first flexible area 202.

In various embodiments, the first circuit board 200 may further include a third conductive pattern (not illustrated) that is related to a 5G antenna module. For example, the 5G antenna module may be located in a recess formed on the frame structure (e.g., the frame structure 141 of FIG. 3) of the support member (e.g., the support member 140 of FIG. 3), and the recess may be formed adjacent to the opening 145 of the support member 140. The third conductive pattern (not illustrated) may electrically connect the 5G antenna module and the processor disposed on the second circuit board 151 or the third circuit board 152.

Referring to FIGS. 5 and 6, the electronic device 100 may further include the fixing bracket 230. The fixing bracket 230 may couple the first circuit board 200 and the support member (e.g., the support member 140 of FIG. 3).

In an embodiment, the fixing bracket 230 may include a first fixing bracket 230-1 coupled to a first edge of the first circuit board 200 and a second fixing bracket 230-2 coupled to a second edge of the first circuit board 200. For example, the first edge and the second edge may be edges of the first circuit board 200 that face the y-axis directions.

Figure 7:
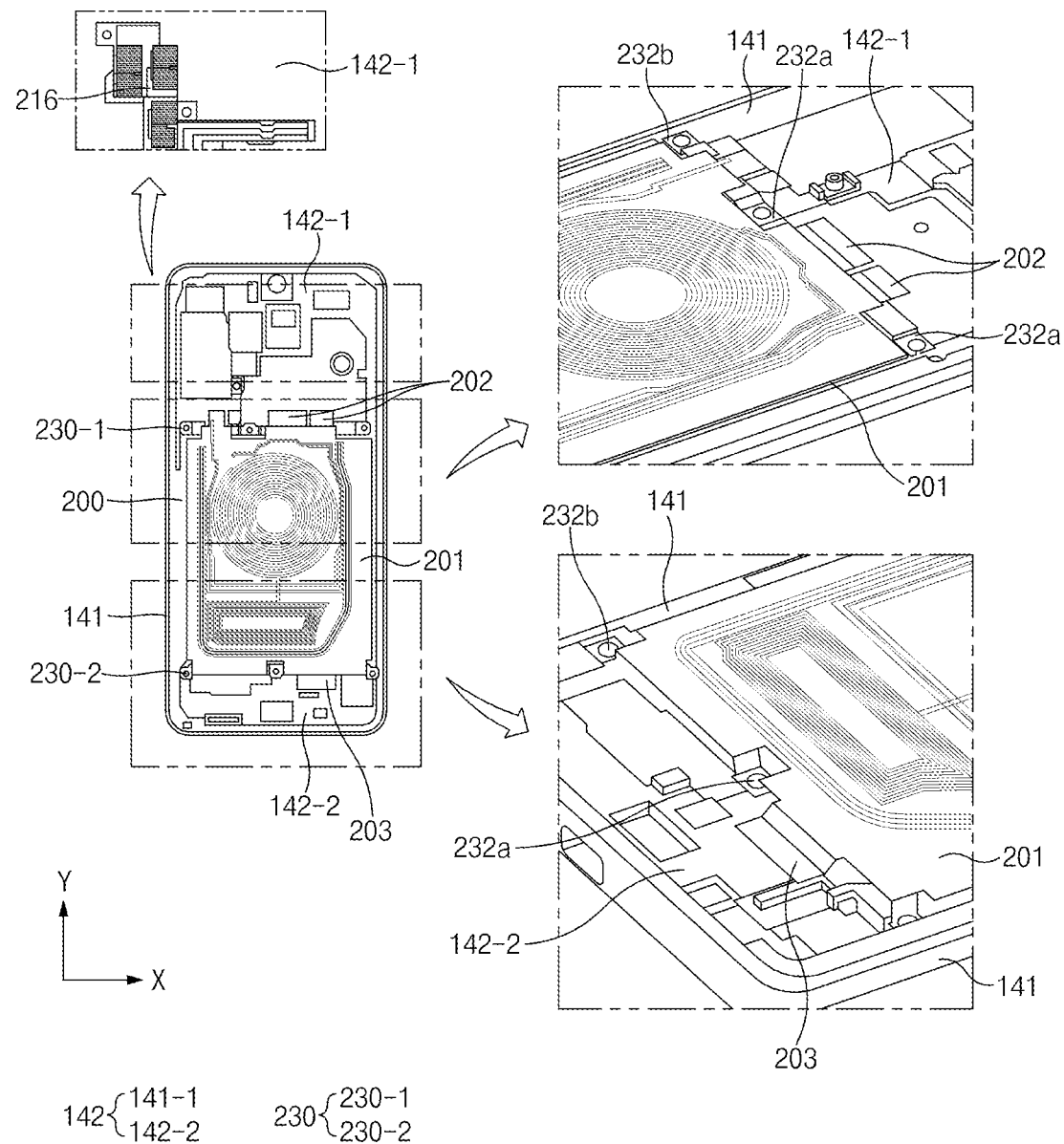
FIG. 7 is a diagram illustrating a support member of the electronic device when viewed from above according to various embodiments.

For example, referring to FIGS. 6 and 7 together, the first fixing bracket 230-1 may be coupled to the first portion 142-1 of the plate structure 142 of the support member 140, and the second fixing bracket 230-2 may be coupled to the second portion 142-2 of the plate structure 142 of the support member 140. In an embodiment, the first circuit board 200 may be disposed to cover the opening 145. In an embodiment, the fixing bracket 230 may include an attachment portion 231 attached to the first circuit board 200 and a coupling portion 232 coupled to the support member 140. The attachment portion 231 may be attached to a third surface 200b of the first circuit board 200. For example, the attachment portion 231 may be attached to the third surface 200b of the first circuit board 200 through a double-sided tape. The third surface 200b of the first circuit board 200 may be a surface facing away from a fourth surface 200a on which a conductive pattern, such as an antenna pattern, is formed. For example, the attachment portion 231 of the first fixing bracket 230-1 may be attached to a first edge of the third surface 200b of the first circuit board 200, and the attachment portion 231 of the second fixing bracket 230-2 may be attached to a second edge of the third surface 200b of the first circuit board 200. In various embodiments, a plurality of attachment portions 231 may be formed, and the coupling portion 232 may be formed between adjacent attachment portions. In an embodiment, the coupling portion 232 may have a screw hole into which a screw is inserted to enable screw coupling.

In an embodiment, the fixing bracket 230 may extend in the x-axis directions and may be coupled to opposite edges of the first circuit board 200 that face the y-axis directions. The coupling portion 232 of the fixing bracket 230 may include a second coupling portion 232b coupled to the frame structure (e.g., the frame structure 141 of FIG. 6) and a first coupling portion 232a coupled to the plate structure (e.g., the plate structure 142 of FIG. 6). For example, the second coupling portion 232b may be formed on a portion extending longer in the x-axis direction than the first circuit board 200.

FIG. 7 is a diagram illustrating the support member of the electronic device when viewed from above according to various embodiments.

In an embodiment, the first circuit board 200 may be formed to be larger than the opening 145 to cover the opening 145 of the support member 140. For example, the first circuit board 200, when viewed in the x-axis directions or the y-axis directions, may extend longer than the opening 145. For example, when the support member 140 is viewed from above, the first circuit board 200 may be disposed to at least partially overlap at least one of the first portion 142-1, the second portion 142-2, and/or the frame structure 141 of the support member 140. For example, referring to the drawing, the first circuit board 200 may be disposed such that the first edge overlaps the first portion 142-1, the second edge overlaps the second portion 142-2, and other portions overlap the frame structure 141.

In an embodiment, the first coupling portion 232a of the first fixing bracket 230-1 may be coupled to the first portion 142-1, and the second coupling portion 232b of the first fixing bracket 230-1 may be coupled to the frame structure 141. As the first fixing bracket 230-1 is coupled to the frame structure 141 and the first portion 142-1, the torsional rigidity of the first circuit board 200 and the support member 140 may be reinforced. For example, the first fixing bracket 230-1 may extend longer in the x-axis directions than the opening 145 to at least partially overlap the frame structure 141. The second coupling portion 232b may be formed on the extending portion.

In an embodiment, the first coupling portion 232a of the second fixing bracket 230-2 may be coupled to the second portion 142-2, and the second coupling portion 232b of the second fixing bracket 230-2 may be coupled to the frame structure 141. As the second fixing bracket 230-2 is coupled to the frame structure 141 and the second portion 142-2, the torsional rigidity of the first circuit board 200 and the support member 140 may be reinforced. For example, the second fixing bracket 230-2 may extend longer in the x-axis directions than the opening 145 to at least partially overlap the frame structure 141. The second coupling portion 232b may be formed on the extending portion.

In an embodiment, the first circuit board 200 may be disposed such that the first flexible area 202 at least partially overlaps the first portion 142-1 of the support member 140 and the second flexible area 203 at least partially overlaps the second portion 142-2 of the support member 140. For example, the first flexible area 202 may extend to the first portion 142-1 so as to be connected to the second circuit board (e.g., the second circuit board 151 of FIG. 3) disposed on the first portion 142-1. For example, the second flexible area 203 may extend to the second portion 142-2 so as to be connected to the third circuit board (e.g., the third circuit board 152 of FIG. 3) disposed on the second portion 142-2.

In an embodiment, the rigid area 201 of the first circuit board 200 and the fixing bracket 230 may reinforce the rigidity of the support member 140 having the opening 145 formed therein.

In various embodiments, the fixing bracket 230 may be formed to at least partially cross the opening 145. In various embodiments, the fixing bracket 230 may be coupled with the support member 140 in the x-axis direction and the y-axis direction. For example, the fixing bracket 230 may be coupled to the frame structure 141 in the x-axis direction and may be coupled to the first portion 142-1 or the second portion 142-2 in the y-axis direction. Accordingly, the bending rigidity and the torsional rigidity of the electronic device 100 may be improved.

In various embodiments, the fixing bracket 230 may be formed of a material capable of providing a predetermined (e.g., specified) strength. For example, the fixing bracket 230 may contain SUS.

In various embodiments, the shape and/or structure of the fixing bracket 230 is not limited to that illustrated in the drawing, and the fixing bracket 230 may include various shapes and/or structures. For example, the fixing bracket 230 may further include a third fixing bracket extending in the y-axis directions.

In various embodiments, a second antenna pattern (not illustrated) may be formed on a portion of the frame structure 141 that is adjacent to the second portion 142-2 of the plate structure 142 or the third circuit board 152. The second antenna pattern may be related to LTE communication. In this case, the second antenna pattern may be connected to the processor or the communication module on the second circuit board 151 through a conductive pattern (e.g., the first conductive pattern 212) included in the first circuit board 200.

In various embodiments, an ultra wide band (UWB) antenna 216 may be disposed on the plate structure 142. For example, referring to the drawing, the UWB antenna 216 may be disposed on the first portion 142-1. The UWB antenna 216 may be connected to the processor or the communication module through a conductive pattern (e.g., the first conductive pattern 212) and the first flexible area 202 that are included in the first circuit board 200.

Figure 8:
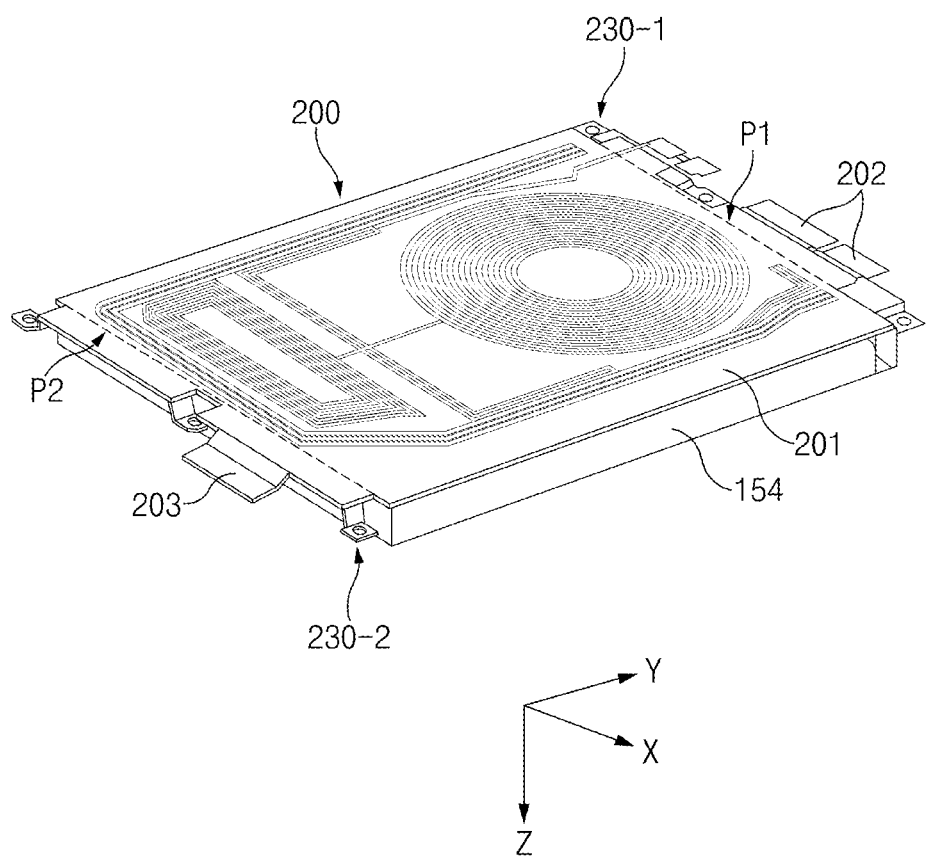
FIG. 8 is a perspective view illustrating the first circuit board, the fixing bracket, and a battery of the electronic device according to various embodiments.
Figure 9:
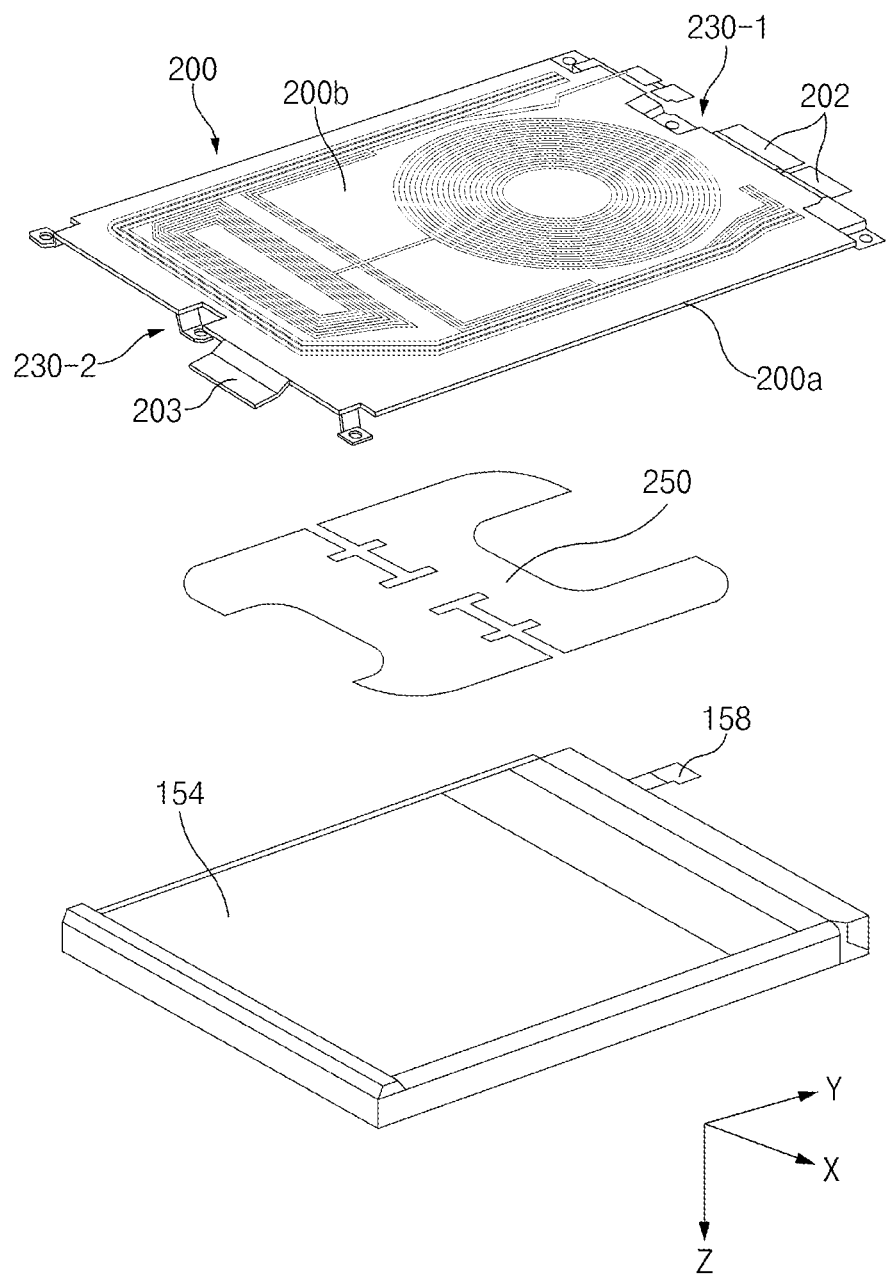
FIG. 9 is an exploded perspective view illustrating the first circuit board, the fixing bracket, and the battery of the electronic device according to various embodiments.

FIG. 8 is a perspective view illustrating the first circuit board, the fixing bracket, and the battery of the electronic device according to various embodiments. FIG. 9 is an exploded perspective view illustrating the first circuit board, the fixing bracket, and the battery of the electronic device according to various embodiments.

In an embodiment, the battery 154 may be at least partially attached to the rear surface of the first circuit board 200. For example, the battery 154 may be disposed on the rear surface (e.g., the third surface 200b) of the rigid area 201 of the first circuit board 200. The battery 154 may be formed to be smaller than the first circuit board 200. For example, the battery 154 may have a smaller length in the y-axis direction than the first circuit board 200 when viewed in the y-axis direction and may have a length less than or equal to that of the first circuit board 200 in the x-axis direction when viewed in the x-axis direction.

In an embodiment, the first fixing bracket 230-1 and the second fixing bracket 230-2 may be disposed on areas to which the battery 154 is not attached. For example, when the first circuit board 200 is viewed from above, the first fixing bracket 230-1 and the second fixing bracket 230-2 may be located in the +y/−y-axis directions with respect to the battery 154.

Referring to FIG. 8, the rigid area 201 of the first circuit board 200 may include a first edge portion P1 that is an edge facing the y-axis direction and a second edge portion P2 that is an edge facing the −y-axis direction. The first edge portion P1 may include a portion extending longer in the y-axis direction than the battery 154 when the first circuit board 200 is viewed from above (e.g., when the first circuit board 200 is viewed in the z-axis direction). The second edge portion P2 may include a portion extending longer in the −y-axis direction than the battery 154 when the first circuit board 200 is viewed from above (e.g., when the first circuit board 200 is viewed in the z-axis direction). Referring to FIG. 8, the first fixing bracket 230-1 may be attached to the first edge portion P1, and the second fixing bracket 230-2 may be attached to the second edge portion P2. Referring to FIG. 8, the first flexible area 202 may extend from the first edge portion P1 of the rigid area 201 in the y-axis direction and may be connected to the second circuit board (e.g., the second circuit board 151 of FIG. 3). The second flexible area 203 may extend from the second edge portion P2 of the rigid area 201 in the −y-axis direction and may be connected to the third circuit board (e.g., the third circuit board 152 of FIG. 3).

Referring to FIG. 9, an adhesive member (e.g., an adhesive, an adhesive layer or an adhesive sheet) 250 may be disposed between the first circuit board 200 and the battery 154. The adhesive member 250 may have an adhesive material applied thereto, or may include a double-sided tape. For example, the adhesive member 250 may be smaller than the battery 154, but may have an area by which the battery 154 and the first circuit board 200 are firmly attached to each other.

In various embodiments, the electronic device 100 may further include a graphite sheet (not shown) disposed on the third surface 200b of the first circuit board 200. The graphite sheet may be configured to dissipate heat generated from the first circuit board and the battery. For example, the graphite sheet may be located between the battery 154 and the first circuit board 200. For example, the graphite sheet may efficiently radiate heat generated from the battery 154 and the first circuit board 200 to the support member.

In an embodiment, the battery 154 may further include a connecting member (e.g., connector) 158 for power transmission/reception. The connecting member 158 may be connected to the first circuit board 200, or may be connected to the second circuit board 151. For example, for connection with the second circuit board (e.g., the second circuit board 151 of FIG. 3), the connecting member 158 may extend in the y-axis direction in which the second circuit board 151 is located. In an embodiment, the battery 154 may be supplied with power received through the charging coil pattern 211. For example, the battery 154 may be supplied with the received power as the connecting member 158 is directly connected to the first circuit board 200. Alternatively, the battery 154 may be supplied with power through the connecting member 158 connected to the second circuit board 151. For example, in a wireless charging process, the battery 154 may receive power received from the charging coil pattern 211 through the connecting member 158 and transmitted to the second circuit board (e.g., the second circuit board 151 of FIG. 3).

Figure 10A:
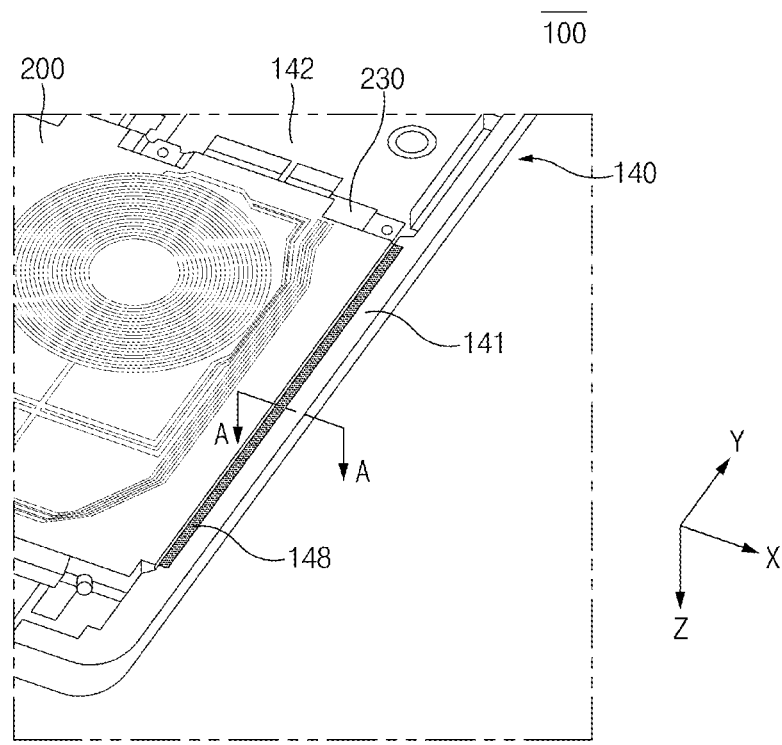
FIG. 10A is a partial perspective view illustrating a first circuit board and a support member of an electronic device according to various embodiments.
Figure 10B:
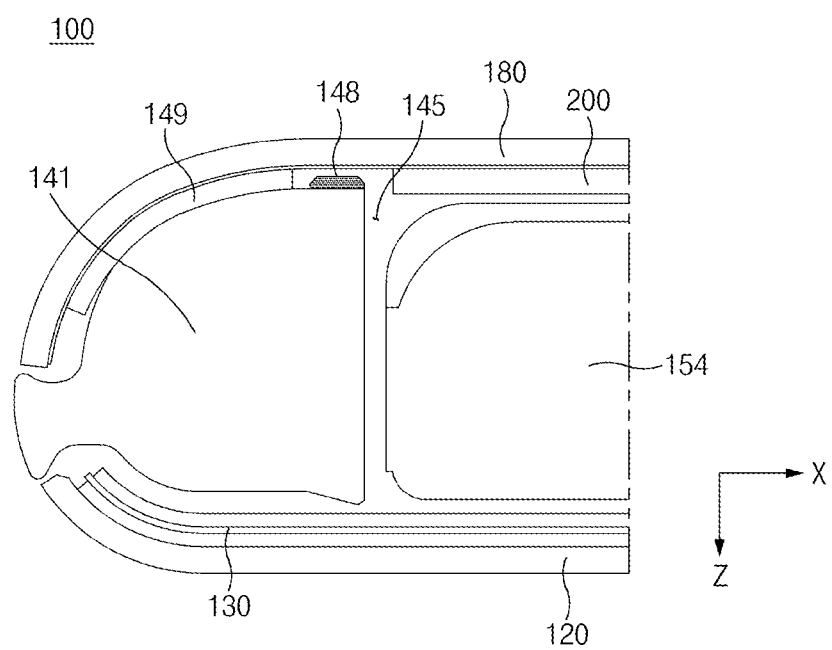
FIG. 10B is a partial cross-sectional view illustrating the first circuit board and the support member of the electronic device according to various embodiments

FIGS. 10A and 10B are views illustrating a first circuit board and a support member of an electronic device according to various embodiments. FIG. 10A is a partial perspective view illustrating a portion of the electronic device. FIG. 10B is a cross-sectional view taken along line A-A in FIG. 10A.

Referring to FIG. 10A, a frame structure 141 of the support member 140 may be formed to surround an opening 145 in which a battery 154 is accommodated. A rib 148 protruding in the z-axis direction may be formed on the frame structure 141. The rib 148 may extend in the y-axis direction. The rib 148 may be formed on a partial area of the frame structure 141 that corresponds to the opening 145. For example, the rib 148 may extend in the long-side direction of the electronic device 100 (e.g., the y-axis direction).

Referring to FIG. 10A, the rib 148 is illustrated as being formed on one side of the battery 154. However, without being necessarily limited thereto, in various embodiments, the rib 148 may be formed on opposite sides of the battery 154.

Referring to FIG. 10B, the battery 154 may be formed so as not to overlap the support member 140 when the battery 154 is viewed in the z-axis direction. For example, the opening 145 may be formed to be larger than the battery 154. For example, the surface of the battery 154 that faces the −z-axis direction may directly face a display 130 as a whole.

Referring to FIG. 10B, a back plate 180 may be attached to the frame structure 141 through an adhesive member 149. In an embodiment, the rib 148 may protrude into the space between the adhesive member 149 and the first circuit board 200. For example, the rib 148 may be configured to at least partially face or make contact with the back plate 180 in the z-axis direction. In an embodiment, the rib 148 may be formed on a portion of the frame structure 141 that is adjacent to the opening 145. As the rib 148 protrudes from the frame structure 141 in the z-axis direction, the thickness of the frame structure 141 adjacent to the opening 145 may be increased. The frame structure 141 having the increased thickness may further reinforce the rigidity of the electronic device 100. For example, the rib 148 may reinforce the torsional rigidity of the electronic device 100.

Figure 11:
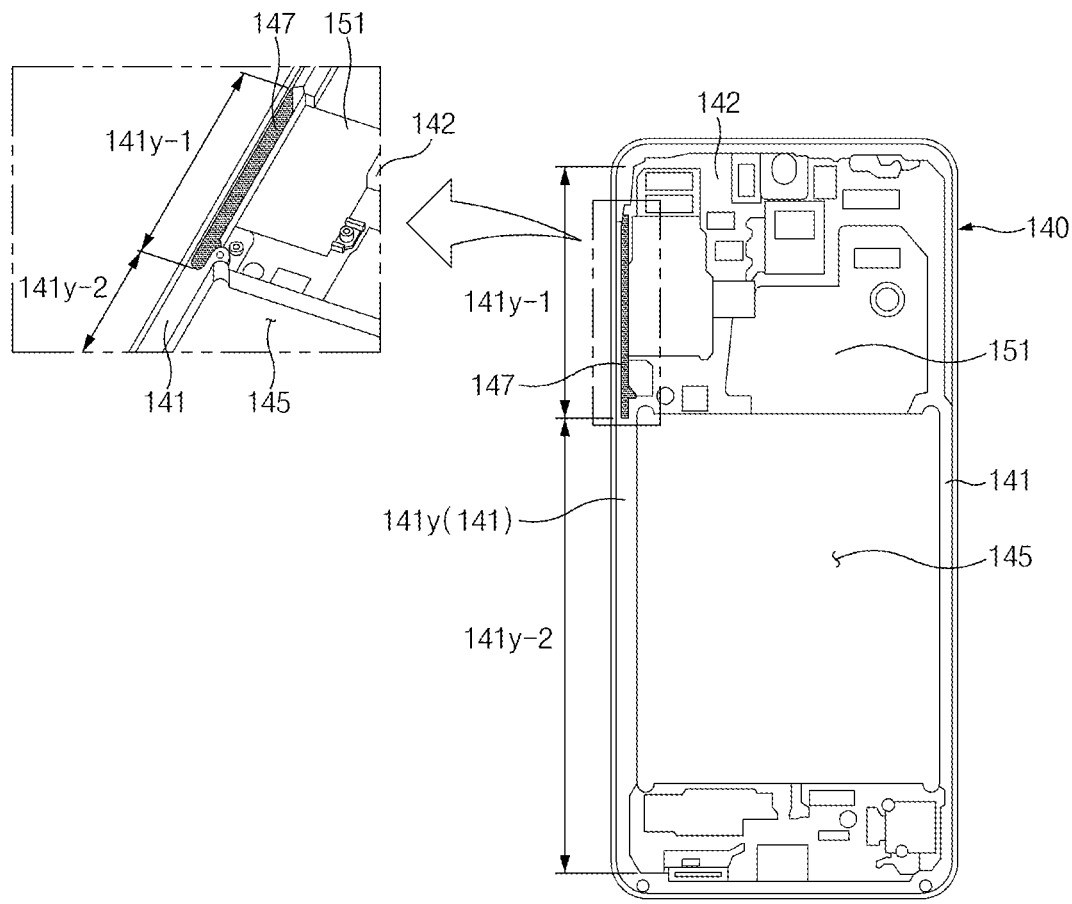
FIG. 11 is a diagram illustrating an opening and a side-key insertion space of an electronic device according to various embodiments.

FIG. 11 is a diagram illustrating an opening and a side-key insertion space of an electronic device according to various embodiments.

Referring to FIG. 11, a frame structure 141 may have the side-key insertion space 147 into which a side key (e.g., the side key 117 of FIG. 1) is inserted. The side-key insertion space 147 may be formed in a portion of the frame structure 141 that extends in the y-axis direction. The side-key insertion space 147 may extend in the y-axis direction to correspond to the shape of the side key. For example, the side-key insertion space 147 may have the form of a recess or opening recessed in the z-axis direction.

In an embodiment, the frame structure 141 may include the portion extending in the y-axis direction. For example, the portion 141y extending in the y-axis direction may include a first area 141y-1 connected to a plate structure 142 of a support member 140 and a second area 141y-2 that forms the opening 145. For example, the second area 141y-2 may surround the opening 145 together with the plate structure 142 of the support member 140. For example, the first area 141y-1 may include a portion adjacent to the first circuit board 200.

In an embodiment, the side-key insertion space 147 may be formed in at least a portion of the first area 141y-1. For example, the side-key insertion space 147 may not extend to the second area 141y-2. For example, when viewed in the x-axis direction, the opening 145 and the side-key insertion space 147 may not overlap each other.

For example, in the case where the side-key insertion space 147 extends to the second area 141y-2 and the opening 145 and the side-key insertion space 147 partially overlap each other, the overlapping portion may degrade the rigidity of the electronic device 100. For example, the overlapping portion may have a reduced metal volume, compared to another portion of the frame structure 141. As the electronic device 100 according to an embodiment is configured such that the side-key insertion space 147 is formed in the first area 141y-1 and the opening 145 is formed in the second area 141y-2, a metal portion of the frame structure 141 may have a predetermined (e.g., specified) volume, and the rigidity of the electronic device 100 may be secured.

Figure 12A:
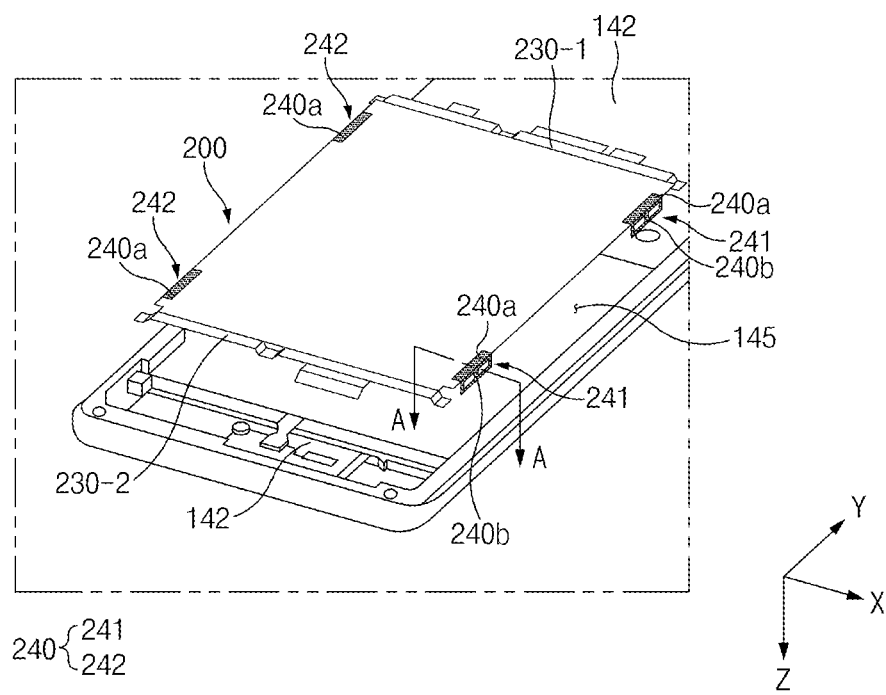
FIG. 12A is a perspective view illustrating a first circuit board and a support member of an electronic device according to various embodiments.
Figure 12B:
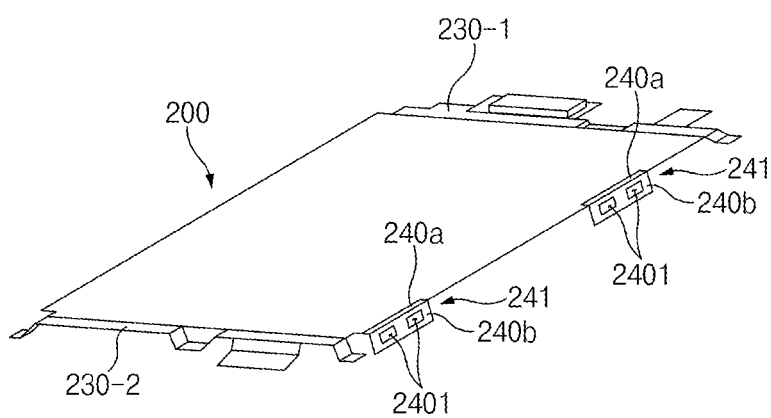
FIG. 12B is a perspective view illustrating the first circuit board and the support member of the electronic device according to various embodiments.
Figure 13:
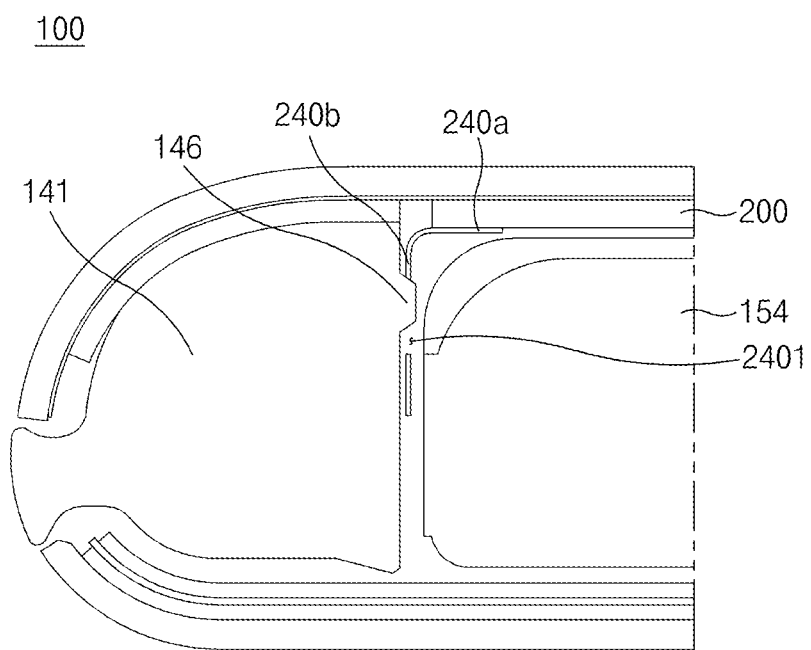
FIG. 13 is a partial cross-sectional view of the electronic device according to various embodiments.

FIGS. 12A and 12B are views illustrating a first circuit board and a support member of an electronic device according to various embodiments. FIG. 12A is a partial exploded perspective view illustrating the first circuit board and the support member. FIG. 12B is a perspective view illustrating the first circuit board. FIG. 13 is a cross-sectional view of the electronic device taken along line A-A in FIG. 12A according to various embodiments.

Referring to FIGS. 12A and 12B, the electronic device 100 may include a first fixing bracket 230-1, a second fixing bracket 230-2, and one or more hooks 240 for coupling the first circuit board 200 and the support member 140. For example, the first fixing bracket 230-1 may be coupled to the edge of the first circuit board 200 that faces the y-axis direction, and the second fixing bracket 230-2 may be coupled to the edge of the first circuit board 200 that faces the −y-axis direction.

In an embodiment, the one or more hooks 240 may be coupled to the edges of the first circuit board 200 that face the x-axis directions. For example, the hooks 240 may include a first hook 241 coupled to the edge facing the x-axis direction and a second hook 242 coupled to the edge facing the −x-axis direction. For example, a plurality of first hooks 241 and a plurality of second hooks 242 may be formed. For example, the plurality of first hooks 241 may be spaced apart from each other in the y-axis direction. The plurality of second hooks 242 may be spaced apart from each other in the y-axis direction.

In an embodiment, the hooks 240 may include a first area 240a surface-coupled to the first circuit board 200 and a second area 240b extending from the first area 240a in the z-axis direction. For example, the first area 240a may be coupled to the first circuit board 200 through, for example, a screw, a tape, or surface mounting (SMD). For example, an opening 2401 may be formed in the second area 240b.

Referring to FIG. 13, an inside surface of a frame structure 141 may include an area at least partially facing a battery 154. A protrusion 146 protruding toward the battery 154 may be formed on the inside surface of the frame structure 141. For example, the protrusion 146 may protrude in the x-axis direction. The protrusion 146 may be at least partially inserted into the opening 2401 formed in the second area 240b of the hook 240. The opening 2401 may be formed through the second area 240b of the hook 240 in the x-axis direction. In various embodiments, a plurality of protrusions 146 may be formed to correspond to the number of hooks 240 and the number of openings 2401.

The electronic device 100 according to an embodiment may include the plurality of hooks 240 for coupling the edges of the first circuit board 200 facing the x-axis directions to the frame structure 141 and the fixing brackets 230-1 and 230-2 for coupling the edges of the first circuit board 200 facing the y-axis directions to the frame structure 141 and the plate structure 142 and may thus secure a predetermined (e.g., specified) rigidity.

An electronic device according to example embodiments of the disclosure may include: a front plate that forms a front surface of the electronic device, a back plate that forms a rear surface of the electronic device, a support located between the front plate and the back plate and including a first surface facing the front plate and a second surface facing the back plate, the support having an opening formed through the first surface and the second surface, a display at least partially disposed on the first surface of the support, a first circuit board, at least a portion of which is disposed on the second surface of the support, the first circuit board including a rigid area at least partially covering the opening, and a battery disposed in the opening of the support member and having a size smaller than or substantially the same as a size of the opening when the first surface or the second surface \of the support is viewed from above, and the battery may be at least partially attached to the rigid area.

In various example embodiments, the second surface of the support may include a first portion located on one side of the opening and a second portion located on an opposite side of the opening, wherein the first circuit board may at least partially extend to each of the first portion and the second portion.

In various example embodiments, the first circuit board may include a wireless charging module including wireless charging circuitry or a wireless charging coil pattern at least partially disposed on the rigid area and configured to charge the battery.

In various example embodiments, the first circuit board may include a first flexible area extending from the rigid area to the first portion and a second flexible area extending from the rigid area to the second portion.

In various example embodiments, the electronic device may further include: a second circuit board disposed on the first portion of the support and a third circuit board disposed on the second portion of the support. The second circuit board may be electrically connected to the first circuit board through the first flexible area, and the third circuit board may be electrically connected to the first circuit board through the second flexible area.

In various example embodiments, the first circuit board may include a plurality of conductive patterns, and the plurality of conductive patterns may include a first conductive pattern formed on at least a part of the rigid area, the first flexible area, and the second flexible area to electrically connect the second circuit board and the third circuit board, a second conductive pattern electrically connected with a display driver integrated circuit (IC) of the display, and an antenna pattern electrically connected with a communication module including communication circuitry.

In various example embodiments, the electronic device may further include a fixing bracket coupling the support and the first circuit board, wherein the fixing bracket may extend to at least partially cross the opening.

In various example embodiments, the fixing bracket may include a coupling portion coupled to the support and an attachment portion attached to the first circuit board, and when the first circuit board is viewed from above, the coupling portion of the fixing bracket may overlap the support and the attachment portion may overlap the first circuit board.

In various example embodiments, the support may include a plate having the opening formed therein and a frame surrounding the plate and forms a surface of the electronic device together with the front plate and the back plate, and the coupling portion of the fixing bracket may include a first coupling portion coupled to the frame and a second coupling portion coupled to the plate.

In various example embodiments, the electronic device may further include an adhesive disposed between the first circuit board and the battery.

In various example embodiments, the electronic device may further include a heat radiating sheet disposed between the first circuit board and the battery and configured to transfer heat generated from the battery and the first circuit board to the support.

An electronic device according to example embodiments of the disclosure may include: a front plate that forms a front surface of the electronic device, a back plate that forms a rear surface of the electronic device, a support located between the front plate and the back plate and having an opening formed therein, a battery disposed in the opening, a first circuit board disposed on the support to at least partially cover the opening and attached to the battery, and a fixing bracket fixing the first circuit board to the support. The support may include a first portion located in a first direction from the opening and a second portion located in a second direction opposite to the first direction, and the fixing bracket may extend in a third direction substantially perpendicular to the first direction and the second direction to at least partially cross the opening.

In various example embodiments, the battery may have a size smaller than or substantially the same as a size of the opening when the support is viewed from above.

In various example embodiments, when the first circuit board is viewed from above, the fixing bracket may include a portion that extends longer in the third direction than the first circuit board.

In various example embodiments, the fixing bracket may include a first fixing bracket coupled to the first portion of the support and the first circuit board and a second fixing bracket coupled to the second portion of the support and the first circuit board.

In various example embodiments, the first circuit board may include a rigid area. When the first circuit board is viewed from above, the rigid area may include a first edge portion extending longer in the first direction than the battery and a second edge portion extending longer in the second direction than the battery. The first fixing bracket may include a first attachment area attached to the first edge portion and a first coupling portion—coupled to the first portion, and the second fixing bracket may include a second attachment area attached to the second edge portion and a second coupling portion coupled to the second portion.

In various example embodiments, the electronic device may further include a second circuit board disposed on the first portion and a third circuit board disposed on the second portion. The first circuit board may include a first flexible area extending from the first edge portion of the rigid area to the second circuit board and a second flexible area extending from the second edge portion of the rigid area to the third circuit board.

In various example embodiments, the support may include a plate including the first portion and the second portion and having the opening formed therein and a frame surrounding the plate structure and forming a surface of the electronic device together with the front plate and the back plate, and the fixing bracket may include a third coupling portion coupled to the frame.

In various example embodiments, the electronic device may further include an adhesive disposed between the first circuit board and the battery.

In various example embodiments, the first circuit board 200 may include a plurality of conductive patterns, and the plurality of conductive patterns may include a first conductive pattern formed on at least a part of the rigid area, the first flexible area, and the second flexible area to electrically connect the second circuit board and the third circuit board, a second conductive pattern electrically connected with a display driver integrated circuit (IC), and an antenna pattern electrically connected with a communication module comprising communication circuitry.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

According to the situation, the expression "adapted to or configured to" used in this disclosure may be used interchangeably with, for example, the expression "suitable for", "having the capacity to", "adapted to", "made to", "capable of", or "designed to" in hardware or software. The expression "a device configured to" may refer, for example, to the device being "capable of" operating together with another device or other components. For example, a "processor set to (or configured to) perform A, B, and C" may refer, for example, to a dedicated processor (e.g., an embedded processor) for performing corresponding operations or a generic-purpose processor (e.g., a CPU or an AP) that performs corresponding operations by executing one or more programs stored in a memory device (e.g., the memory 130).

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. The "module" may be implemented mechanically or electronically and may include, for example, an application-specific integrated circuit (ASIC) chip, field-programmable gate arrays (FPGAs), or a programmable-logic device for performing some operations, which are known or will be developed.

At least a part of an apparatus (e.g., modules or functions thereof) or a method (e.g., operations) according to various embodiments may be implemented by instructions stored in non-transitory computer-readable storage media (e.g., the memory 130) in the form of a program module. The instructions, when executed by a processor (e.g., the processor 120), may cause the processor to perform functions corresponding to the instructions. The non-transitory computer-readable storage media may include a hard disk, a floppy disk, a magnetic media (e.g., a magnetic tape), an optical media (e.g., CD-ROM, DVD, magneto-optical media (e.g., a floptical disk)), an embedded memory, and the like. The instructions may include a code made by a compiler or a code executable by an interpreter.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   a front plate forming a front surface of the electronic device;
   a back plate forming a rear surface of the electronic device;
   a support located between the front plate and the back plate, the support including a first surface facing the front plate and a second surface facing the back plate, wherein the support has an opening formed through the first surface and the second surface;
   a display at least partially disposed on the first surface of the support;
   a first circuit board, at least a portion of which is disposed on the second surface of the support, the first circuit board including a rigid area at least partially covering the opening; and
   a battery disposed in the opening of the support and having a size smaller than or substantially the same as a size of the opening when the first surface or the second surface of the support is viewed from above, wherein the battery is at least partially attached to the rigid area.

2. The electronic device of claim 1, wherein the second surface of the support includes a first portion located on one side of the opening and a second portion located on an opposite side of the opening, and wherein the first circuit board at least partially extends to each of the first portion and the second portion.

3. The electronic device of claim 1, wherein the first circuit board includes a wireless charging module comprising wireless charging circuitry or a wireless charging coil pattern at least partially disposed on the rigid area and configured to charge the battery.

4. The electronic device of claim 2, wherein the first circuit board includes a first flexible area extending from the rigid area to the first portion and a second flexible area extending from the rigid area to the second portion.

5. The electronic device of claim 4, wherein the electronic device further comprises a second circuit board disposed on the first portion of the support and a third circuit board disposed on the second portion of the support, wherein the second circuit board is electrically connected to the first circuit board through the first flexible area, and wherein the third circuit board is electrically connected to the first circuit board through the second flexible area.

6. The electronic device of claim 5, wherein the first circuit board includes a plurality of conductive patterns, and wherein the plurality of conductive patterns include a first conductive pattern formed on at least a part of the rigid area, the first flexible area, and the second flexible area to electrically connect the second circuit board and the third circuit board, a second conductive pattern electrically connected with a display driver integrated circuit (IC) of the display, and an antenna pattern electrically connected with a communication module comprising communication circuitry.

7. The electronic device of claim 1, further comprising:
a fixing bracket coupling the support and the first circuit board, wherein the fixing bracket extends to at least partially cross the opening.

8. The electronic device of claim 7, wherein the fixing bracket includes a coupling portion coupled to the support and an attachment portion attached to the first circuit board, and wherein when the first circuit board is viewed from above, the coupling portion of the fixing bracket overlaps the support and the attachment portion overlaps the first circuit board.

9. The electronic device of claim 8, wherein the support includes a plate having the opening formed therein and a frame surrounding the plate and forming a surface of the electronic device together with the front plate and the back plate, and wherein the coupling portion of the fixing bracket includes a first coupling portion coupled to the frame and a second coupling portion coupled to the plate.

10. The electronic device of claim 1, further comprising:
an adhesive disposed between the first circuit board and the battery.

11. The electronic device of claim 1, further comprising:
a heat radiating sheet disposed between the first circuit board and the battery and configured to transfer heat generated from the battery and the first circuit board to the support.

12. An electronic device comprising:
a front plate forming a front surface of the electronic device;
a back plate forming a rear surface of the electronic device;
a support located between the front plate and the back plate, the support having an opening formed therein;
a battery disposed in the opening;
a first circuit board disposed on the support to at least partially cover the opening and attached to the battery; and
a fixing bracket fixing the first circuit board to the support,
wherein the support includes a first portion located in a first direction from the opening and a second portion located in a second direction opposite to the first direction, and
wherein the fixing bracket extends in a third direction substantially perpendicular to the first direction and the second direction to at least partially cross the opening.

13. The electronic device of claim 12, wherein the battery has a size smaller than or substantially the same as a size of the opening when the support is viewed from above.

14. The electronic device of claim 12, wherein when the first circuit board is viewed from above, the fixing bracket includes a portion extending longer in the third direction than the first circuit board.

15. The electronic device of claim 12, wherein the fixing bracket includes a first fixing bracket coupled to the first portion of the support and the first circuit board and a second fixing bracket coupled to the second portion of the support and the first circuit board.

16. The electronic device of claim 15, wherein the first circuit board includes a rigid area,
wherein when the first circuit board is viewed from above, the rigid area includes a first edge portion extending longer in the first direction than the battery and a second edge portion extending longer in the second direction than the battery,
wherein the first fixing bracket includes a first attachment area attached to the first edge portion and a first coupling portion coupled to the first portion, and
wherein the second fixing bracket includes a second attachment area attached to the second edge portion and a second coupling portion coupled to the second portion.

17. The electronic device of claim 16, further comprising:
a second circuit board disposed on the first portion and a third circuit board disposed on the second portion,
wherein the first circuit board includes a first flexible area extending from the first edge portion of the rigid area to the second circuit board and a second flexible area extending from the second edge portion of the rigid area to the third circuit board.

18. The electronic device of claim 12, wherein the support includes a plate including the first portion and the second portion and having the opening formed therein and a frame surrounding the plate and forming a surface of the electronic device together with the front plate and the back plate, and
wherein the fixing bracket includes a third coupling portion coupled to the frame.

19. The electronic device of claim 12, further comprising:
an adhesive disposed between the first circuit board and the battery.

20. The electronic device of claim 17, wherein the first circuit board includes a plurality of conductive patterns, and wherein the plurality of conductive patterns include a first conductive pattern formed on at least a part of the rigid area, the first flexible area, and the second flexible area to electrically connect the second circuit board and the third circuit board, a second conductive pattern electrically connected with a display driver integrated circuit (IC), and an antenna pattern electrically connected with a communication module comprising communication circuitry.

* * * * *